US010359659B2

(12) United States Patent
Dunn et al.

(10) Patent No.: US 10,359,659 B2
(45) Date of Patent: Jul. 23, 2019

(54) COOLING SYSTEM FOR ELECTRONIC DISPLAY

(71) Applicant: Manufacturing Resources International, Inc., Alpharetta, GA (US)

(72) Inventors: William Dunn, Alpharetta, GA (US); Kevin O'Connor, Duluth, GA (US)

(73) Assignee: MANUFACTRUING RESOURCES INTERNATONAL, INC., Alpharetta, GA (US)

(*) Notice: Subject to any disclaimer, the term of this patent is extended or adjusted under 35 U.S.C. 154(b) by 0 days.

(21) Appl. No.: 16/114,049

(22) Filed: Aug. 27, 2018

(65) Prior Publication Data

US 2018/0364519 A1 Dec. 20, 2018

Related U.S. Application Data

(63) Continuation of application No. 15/289,563, filed on Oct. 10, 2016, now Pat. No. 10,088,702, which is a (Continued)

(51) Int. Cl.
*G06F 1/16* (2006.01)
*H05K 5/00* (2006.01)
(Continued)

(52) U.S. Cl.
CPC ... *G02F 1/133382* (2013.01); *H05K 7/20972* (2013.01); *G02F 1/133385* (2013.01); *G02F 2201/36* (2013.01)

(58) Field of Classification Search
CPC .... G06F 1/1601; G06F 1/1616; G06F 1/1618; G06F 1/162; G06F 1/1622; G06F 1/1624;
(Continued)

(56) References Cited

U.S. PATENT DOCUMENTS 4,093,355 A 6/1978 Kaplit et al.
4,593,978 A 6/1986 Mourey et al.
(Continued)

FOREIGN PATENT DOCUMENTS

AU 2011248190 B2 5/2011
AU 2014287438 B2 1/2018
(Continued)

OTHER PUBLICATIONS

Itsenclosures, Product Catalog, 2009, 48 pages.
(Continued)

*Primary Examiner* — Anthony M Haughton
(74) *Attorney, Agent, or Firm* — Standley Law Group LLP; Jeffrey S. Standley; Adam J. Smith

(57) ABSTRACT

A cooling assembly for an electronic display includes a front channel that passes in front of the viewable area of the electronic display. A center channel is located behind the electronic display. A rear channel is located behind the second channel. A first plurality of subchannels are located within the center channel and connect only to the front channel. A second plurality of subchannels are located within the center channel and connect only to the rear channel.

20 Claims, 7 Drawing Sheets

Related U.S. Application Data continuation of application No. 14/326,059, filed on Jul. 8, 2014, now Pat. No. 9,470,924.

(60) Provisional application No. 61/843,706, filed on Jul. 8, 2013.

(51) Int. Cl.
*H05K 7/00* (2006.01)
*G02F 1/1333* (2006.01)
*H05K 7/20* (2006.01)

(58) Field of Classification Search
CPC ...... G06F 1/1628; G06F 1/163; G06F 1/1633; G06F 1/169; G06F 1/1643; G06F 1/20; G06F 1/203; G06F 1/206; H05K 7/20972; G02F 1/133382
USPC .............. 361/679.21–679.3, 679.55, 679.56, 361/692–695, 679.4–679.44, 679.37, 361/679.48–679.51
See application file for complete search history.

(56) References Cited

U.S. PATENT DOCUMENTS

| | | | |
|---|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,282,114 A | 1/1994 | Stone |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,473,150 B1 | 10/2002 | Takushima et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,701,143 B1 | 3/2004 | Dukach et al. |
| 6,714,410 B2 | 3/2004 | Wellhofer |
| 6,727,468 B1 | 4/2004 | Nemeth |
| 6,812,851 B1 | 11/2004 | Dukach et al. |
| 6,825,828 B2 | 11/2004 | Burke et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfeller |
| 7,259,964 B2 | 8/2007 | Yamamura et al. |
| 7,269,023 B2 | 9/2007 | Nagano |
| 7,284,874 B2 | 10/2007 | Jeong et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |

(56) References Cited

U.S. PATENT DOCUMENTS

| | | |
|---|---|---|
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,370,127 B2 | 6/2016 | Dunn |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,894,800 B2 | 2/2018 | Dunn |
| 2001/0001459 A1 | 5/2001 | Savant et al. |
| 2001/0019454 A1 | 9/2001 | Tadic-Galeb et al. |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0310116 A1 | 12/2008 | O'Connor |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0244472 A1 | 10/2009 | Dunn |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |

(56) References Cited

U.S. PATENT DOCUMENTS

| | | |
|---|---|---|
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn ............... G02F 1/133385 361/695 |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0141724 A1 | 6/2011 | Edon |
| 2011/0261523 A1 | 10/2011 | Dunn et al. |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0106081 A1* | 5/2012 | Hubbard ............ G02F 1/133308 361/696 |
| 2012/0188481 A1 | 7/2012 | Kang et al. |
| 2012/0206687 A1 | 8/2012 | Dunn et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0313698 A1 | 10/2014 | Dunn et al. |
| 2014/0314395 A1 | 10/2014 | Dunn et al. |
| 2015/0009627 A1 | 1/2015 | Dunn et al. |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2018/0042134 A1 | 2/2018 | Dunn et al. |
| 2018/0116073 A1 | 4/2018 | Dunn |

FOREIGN PATENT DOCUMENTS

| | | |
|---|---|---|
| AU | 2015253128 B2 | 3/2018 |
| CA | 2705814 C | 2/2018 |
| CA | 2947524 C | 4/2018 |
| CN | 2702363 Y | 5/2005 |
| CN | 107251671 A | 10/2017 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002185475 A | 5/2002 |
| JP | 2004053749 A | 2/2004 |
| JP | 2004-199675 A | 7/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |

(56) References Cited

FOREIGN PATENT DOCUMENTS

| | | |
|---|---|---|
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | 2013182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation,Turn Key Advertising Technology Solutions, May 23, 2017, 4 pages.
CIVIQ Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
CIVIQ, Invalidity Claim Charts, Appendix A-Appendix D, Jan. 24, 2018, 51 pages.
CIVIQ, Invalidity Contentions, Jan. 24, 2018, 51 page
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
CIVIQ, Invalidity Claim Chart, Appendix I, Mar. 22, 2018, 4 pages.
CIVIQ, Invalidity Claim Charts, Appendix F to H, Mar. 22, 2018, 18 pages.
Yung, Using Metal Core Printed Circuit Board as a Solution for Thermal Management article, 2007, 5 pages.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifilin Company.
*CIVIQ Smartscapes LLC.* v *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*CIVIQ Smartscapes LLC.* v *Manufacturing Resources International, Inc.*, Defendant's Amended Answer and Counterclaims to Plaintiffs First Amended Complaint, Filed Apr. 24, 2018, 240 pages.

* cited by examiner

COOLING SYSTEM FOR ELECTRONIC DISPLAY

CROSS-REFERENCE TO RELATED APPLICATIONS

This application is a continuation of U.S. patent application Ser. No. 15/289,563 filed on Oct. 10, 2016, which is a continuation of U.S. patent application Ser. No. 14/326,059 filed on Jul. 8, 2014 now U.S. Pat. No. 9,470,924, which claims priority to U.S. Provisional Application No. 61/843,706 filed on Jul. 8, 2013, the disclosures of each of these applications are hereby incorporated by reference in their entireties.

TECHNICAL FIELD

Embodiments generally relate to cooling systems for electronic displays.

BACKGROUND OF THE ART

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE EXEMPLARY EMBODIMENTS

Exemplary embodiments provide a figure eight closed loop circulating gas path which defines a center channel for the closed loop of circulating gas. A pair of open loop ambient air channels may be placed on opposite sides of the center channel, in order to remove heat from at least the center channel and the closed loop circulating gas. One or more open loop ambient air pathways may pass through the figure eight but do not allow the circulating gas and the ambient air to mix. In some embodiments, the open loop ambient air pathway travels along a rear surface of the electronic display. In some embodiments, the circulating gas pathways contain a front channel placed in front of the electronic display, a rear channel placed behind the electronic display, and a center channel placed between the front and rear channels. Pass-through apertures may be placed within the path of the circulating gas and/or the ambient air to allow the paths of the two gaseous matters to cross without allowing them to mix with one another.

The foregoing and other features and advantages of the present invention will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
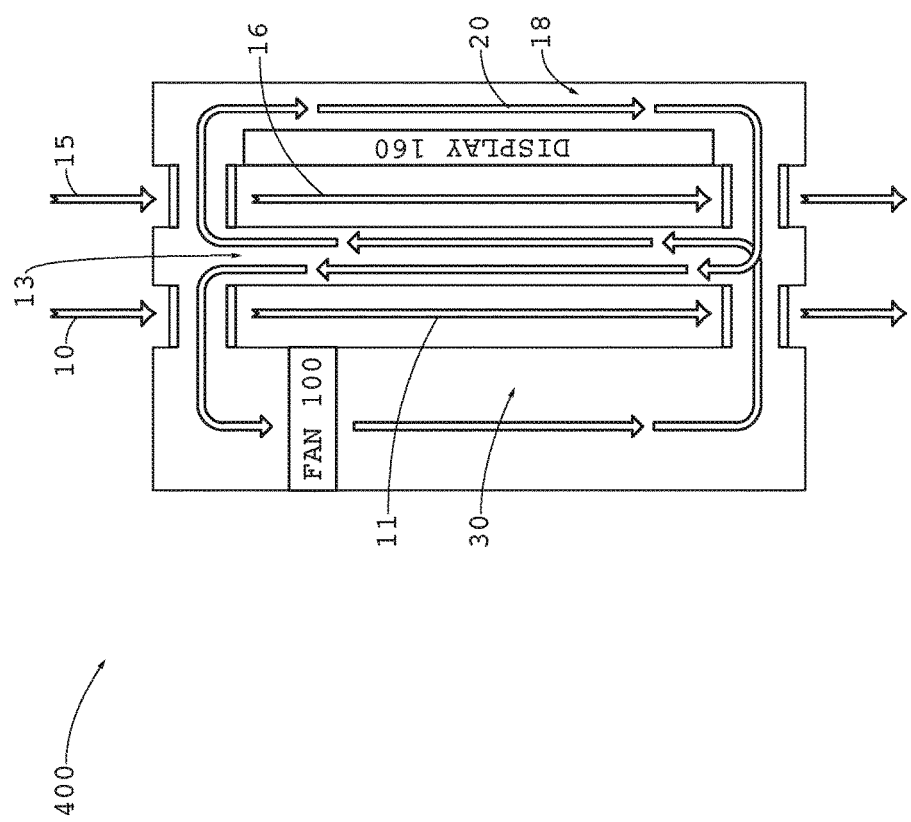
FIG. 1 is a simplified illustration of an exemplary embodiment of the figure eight closed loop cooling system.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a simplified illustration of an exemplary embodiment of the figure eight closed loop cooling system 400. This exemplary embodiment contains a plurality of channels in the assembly. The front channel 18 is placed in front of the display 160 and preferably allows closed loop circulating gas 20 to remove heat from the front of the display 160. The front open loop channel 16 is positioned behind the display 160 and preferably allows open loop air 15 to pass behind the display 160, removing heat at least from the rear portion of the display 160 and the center channel 13. The center channel 13 is preferably positioned between the front open loop channel 16 and the rear open loop channel 11 and allows closed loop circulating gas 20 to cross paths with itself (creating the figure eight) and to cross paths with the open loop air 10 and 15 without allowing the closed loop circulating gas and open loop air to mix.

The rear open loop channel 11 is preferably positioned immediately adjacent to the center channel 13, and allows open loop air 10 to flow through, thereby removing heat from the center channel 13 (and/or the closed loop circulating gas 13 contained within) and the rear channel 30. The rear channel 30 is positioned near the rear of the display and may contain various electronic components 35 for operating the overall display assembly, fans, or the display 160 itself.

In an exemplary embodiment, the front channel 18, center channel 13, and rear channel 30 are in sealed gaseous communication with each other. In other words, these channels do not permit closed loop circulating gas 20 to substantially escape or to allow ambient air or open loop air to enter these channels. Also in an exemplary embodiment, open loop air 10 and 15 is simply ambient air surrounding the display assembly. However, in some embodiments the open loop air 10 and 15 may be treated in some way (ex. filtered, air conditioned, or pre-cooled in some way) prior to being ingested into the display assembly. In this particular embodiment, the closed loop fan 100 is positioned within the rear channel 30, although this is not required. All that is required is that the closed loop fan 100 is positioned to force the closed loop circulating gas 20 through the front channel 18, center channel 13, and rear channel 30. The closed loop circulating gas 20 can be any gaseous matter that preferably does not contain large amounts of particulate. However, it does not have to be pure gas of any type; simple clean air works fine with the exemplary embodiments.

Figure 2:
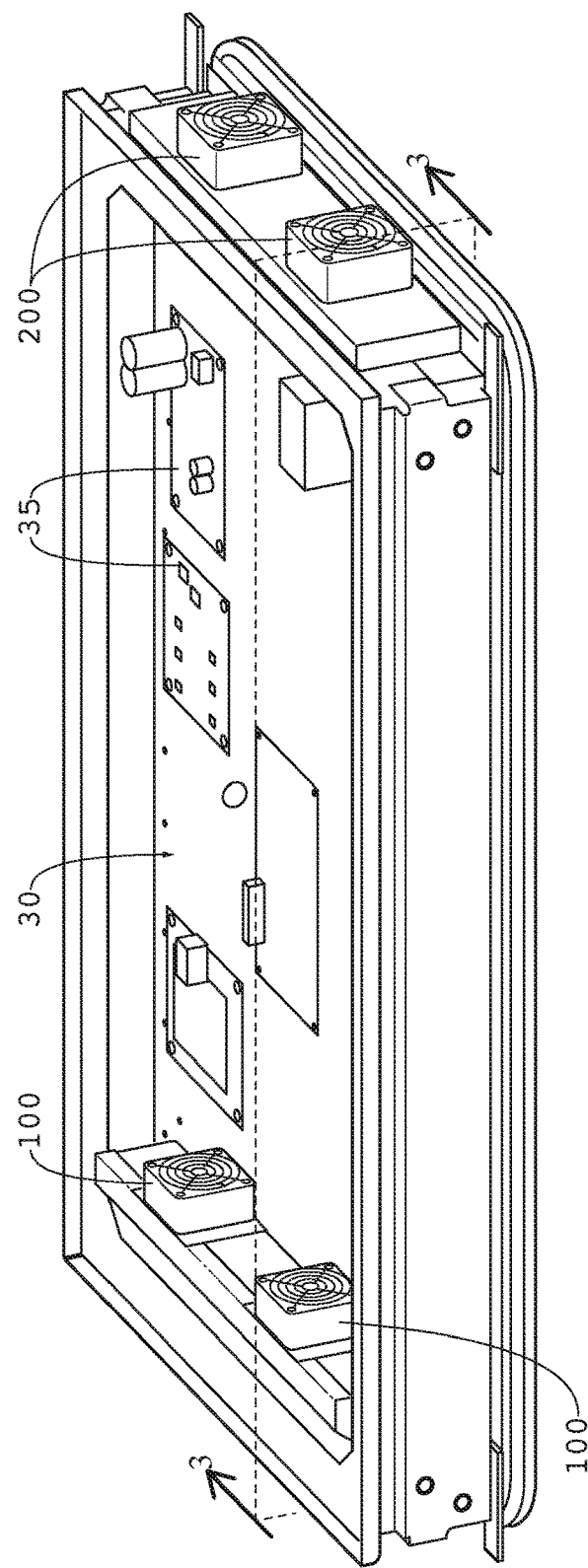
FIG. 2 is a side rear perspective view showing the overall assembly of the display with the rear cover removed and indicating the section line 3-3.

FIG. 2 is a side rear perspective view showing the overall assembly of the display with the rear cover removed and indicating the section line 3-3. In this particular embodiment, the display assembly is designed for a portrait orientation with the closed loop fans 100 positioned at the top of the assembly and the open loop fans 200 positioned at the bottom of the assembly. This is of course not required however, as the embodiments herein can be flipped or oriented for a landscape orientation if desired. Further, the open loop fans 200 do not have to be placed at the bottom of the assembly, but could be positioned anywhere so that the open loop air travels in the paths specified in these exemplary embodiments. It of course goes without saying that additional fans could also be used to increase flow rates and/or pressure.

Figure 3:
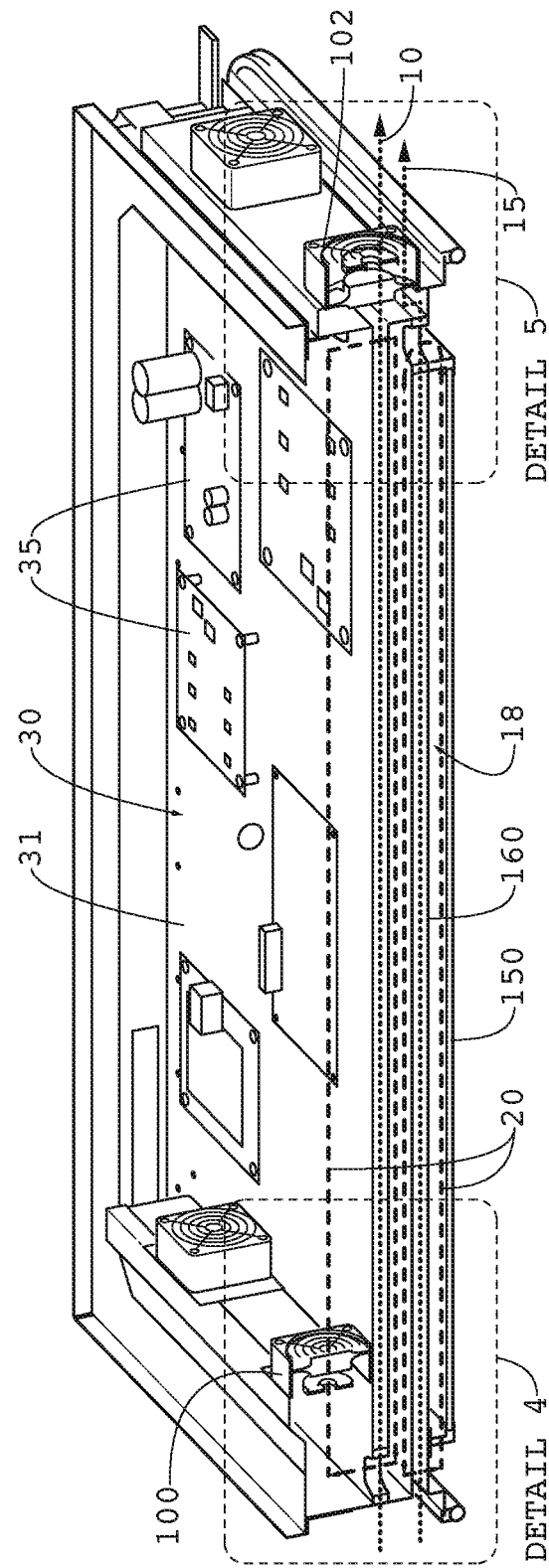
FIG. 3 is a perspective section view taken from the section line 3-3 and indicating the locations for Detail 4 and Detail 5.

FIG. 3 is a perspective section view taken from the section line 3-3 and indicating the locations for Detail 4 and Detail 5. Here, the front channel 18 is defined between the front transparent plate 150 and the electronic display 160. In an exemplary embodiment the electronic display 160 may be an LED backlit liquid crystal display (LCD), but this is not required. Alternative embodiments may utilize any type of flat panel electronic display, including but not limited to plasma, OLED, electroluminescent polymers, or similar. In some embodiments, the various electrical components 35 (power supplies, printed circuit boards, microprocessors, electronic storage, etc.) may be attached and in thermal communication with a plate 31 which may form the rear portion of channel 11 for open loop air 10. In this way, heat that is generated by the electrical components 35 may be transferred to the plate 31, where it can be removed by open loop air 10.

Figure 4:
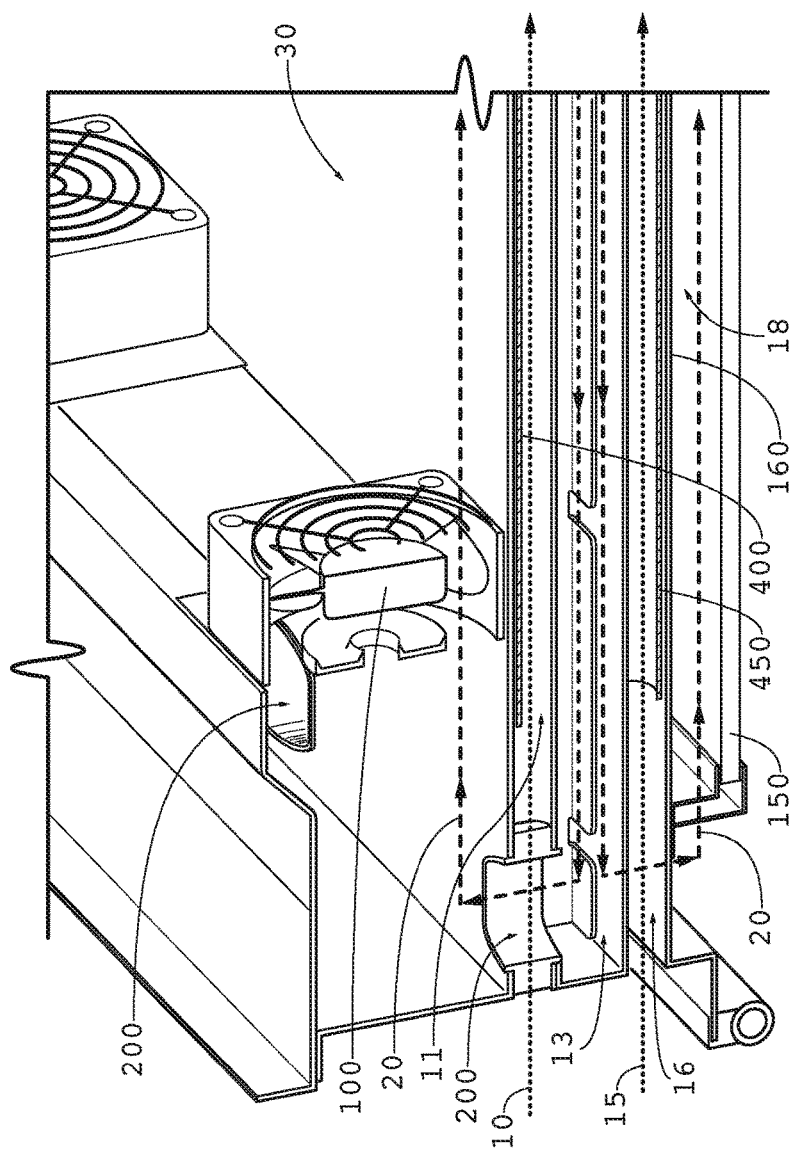
FIG. 4 is a detailed perspective section view of Detail 4.

FIG. 4 is a detailed perspective section view of Detail 4. Closed loop circulating gas 20 is permitted to pass through the rear open loop channel 11 without mixing with the open loop air 10 by use of pass-through apertures 200, which provide sealed gaseous communication between the rear channel 30 and the center channel 13, without permitting open loop air 10 to enter the channels 30 and 13. In an exemplary embodiment, rear open loop channel 11 may also contain cooling fins 400 for distributing heat from the adjacent channels (30 and 13) and/or electronic components 35 in order to be efficiently removed by the open loop air 10. Similarly, front open loop channel 16 may also contain cooling fins 450 for distributing heat from the adjacent channels (30 and 18) and/or the rear surface of the display 160 in order to be efficiently removed by the open loop air 15. In an exemplary embodiment, the display 160 contains a direct lit LED backlight where the cooling fins 450 are placed in thermal communication with the LED backlight. The cooling fins 450 and 400 may be comprised of any thermally conductive material, but would preferably be comprised of metal and in an exemplary embodiment would be a thin sheet (or multiple thin sheets) of metal.

Figure 5:
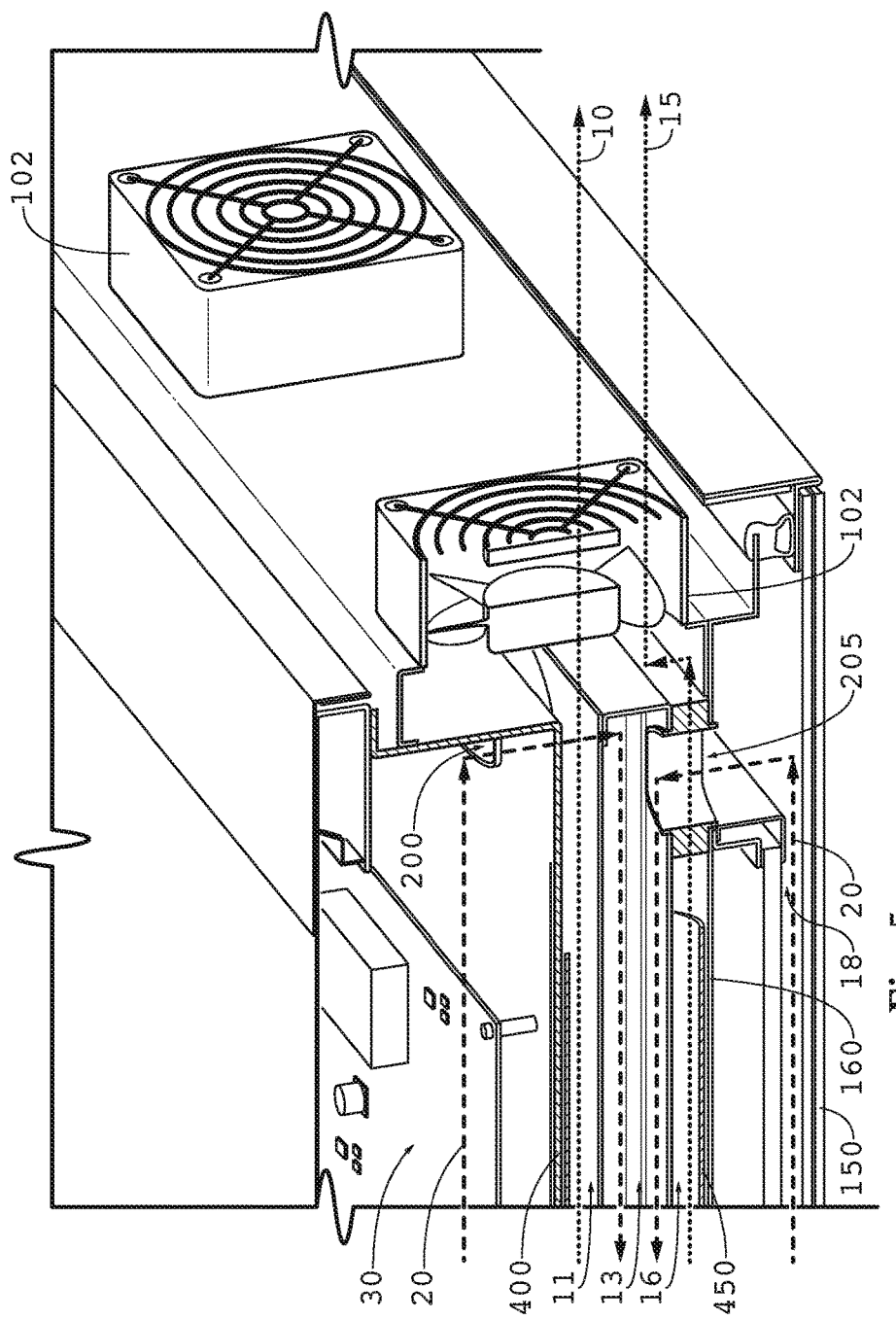
FIG. 5 is a detailed perspective section view of Detail 5.

FIG. 5 is a detailed perspective section view of Detail 5. Closed loop circulating gas 20 is permitted to pass through the front open loop channel 16 without mixing with the open loop air 15 by use of pass-through apertures 205, which provide sealed gaseous communication between the front channel 18 and the center channel 13, without permitting open loop air 15 to enter the channels 18 and 13.

Figure 6:
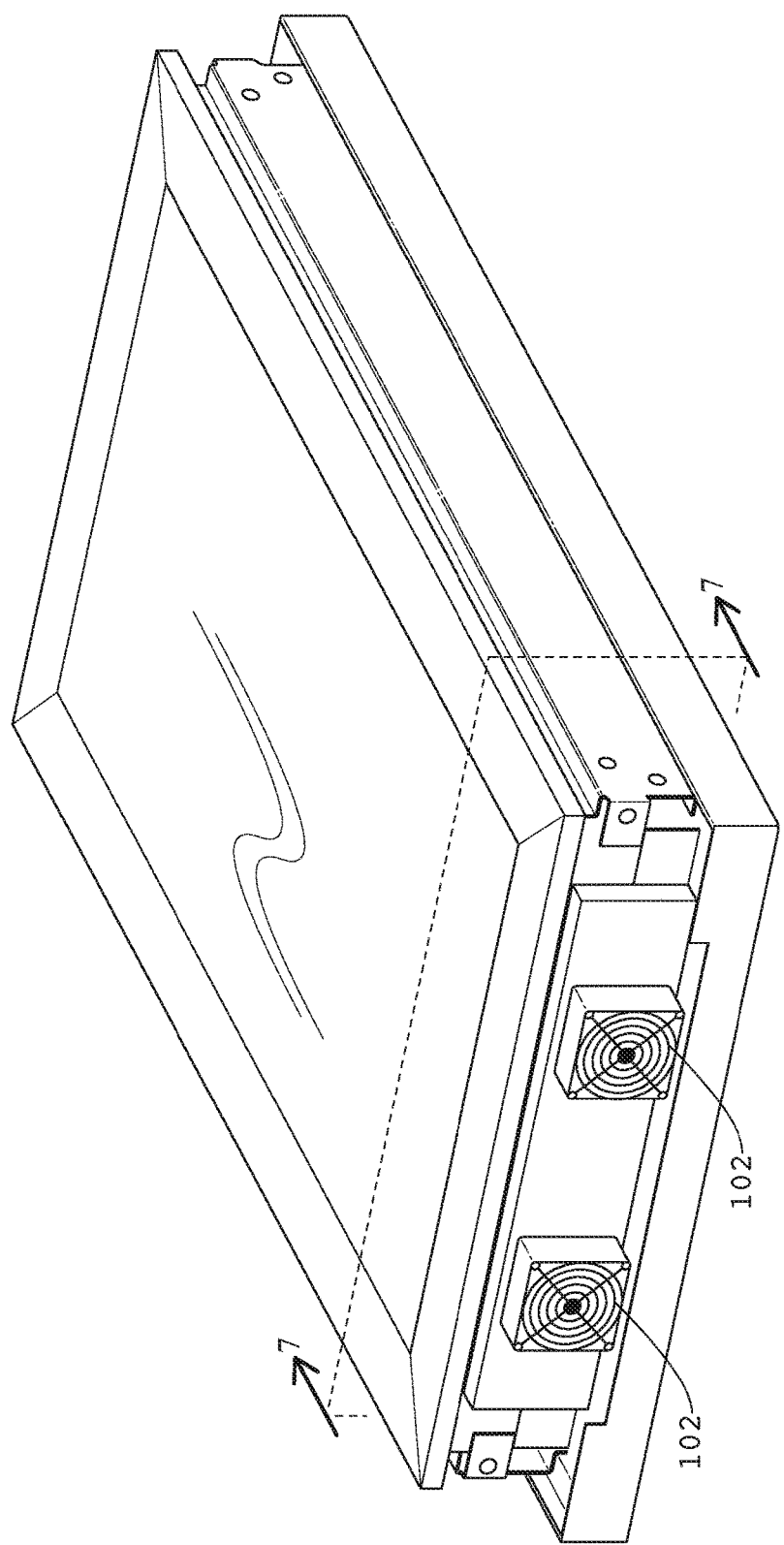
FIG. 6 is a bottom rear perspective view showing the overall assembly of the display and indicating the section line 7-7.

FIG. 6 is a bottom rear perspective view showing the overall assembly of the display and indicating the section line 7-7.

Figure 7:
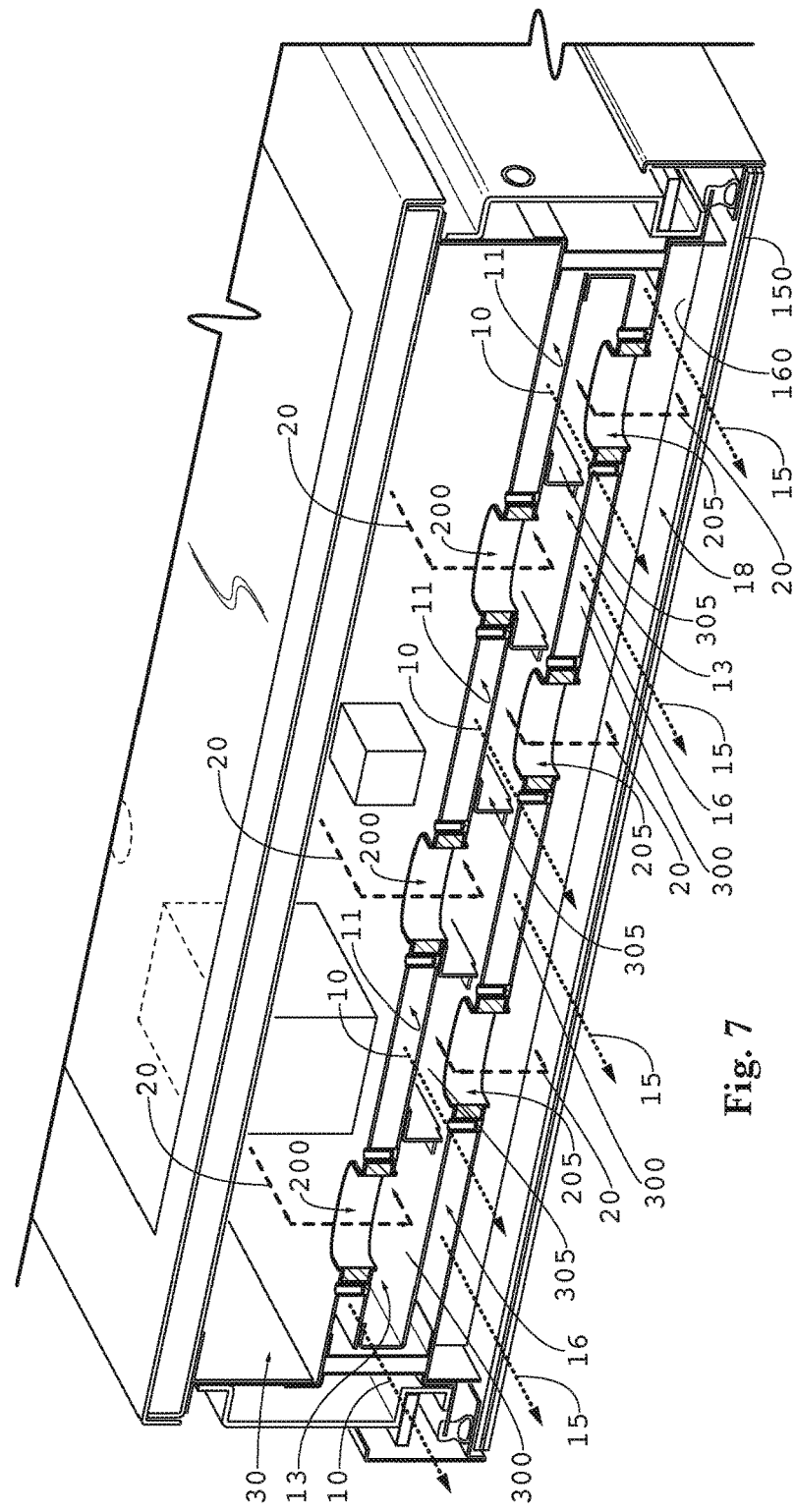
FIG. 7 is a perspective section view taken from the section line 7-7.

FIG. 7 is a perspective section view taken from the section line 7-7. The center channel 13 is preferably divided into a plurality of subchannels 300 and 305. On this end of the overall assembly, subchannels 300 are in gaseous communication with the pass-through apertures 200 (which connects the subchannel 300 with the rear channel 30) while subchannels 305 are in gaseous communication with the pass-through apertures 205 (which connects the subchannel 305 with the front channel 18). However, on the opposite end of the assembly (see FIG. 3) subchannels 300 are in gaseous communication with the pass-through apertures 205 (which connects the subchannel 300 with the front channel 18) while subchannels 305 are in gaseous communication with the pass-through apertures 200 (which connects the subchannel 305 with the rear channel 30). In this way, the closed loop of circulating gas 20 travels through the front channel 18, through a pass-through aperture to travel along subchannel 305, through another pass-through aperture to travel along the rear channel 30, through another pass-through aperture to travel along the subchannel 300, and finally through another pass-through aperture to return to the front channel 18. In this way, the closed loop of circulating gas 20 performs the 'figure eight' through the assembly, as it weaves its way across the front channel 18, through the center channel 13, across the rear channel 30, again through the center channel 13, and returning to the front channel 18.

It should be noted that subchannels 300 and 305 may not be required in some embodiments as the center channel 13 could be completely open. It should also be noted that other embodiments may use the subchannels 300 and 305 but would not allow a single subchannel to communicate gaseously with both the front channel 18 and the rear channel 30. In other words, when viewing the end of the assembly as shown in FIG. 7, the opposing end of the assembly would be substantially similar. Thus, subchannels 300 would only communicate with pass-through apertures 200 and the rear channel 30, while the subchannels 305 would only communicate with pass-through apertures 205 and front channel 18. Thus, in this embodiment there would be two separate closed loops.

Although there is preferably gaseous communication throughout the figure eight, subchannel 300 directs the flow of closed loop circulating gas 20 through rear channel 30 and center channel 13 while subchannel 305 directs the flow of closed loop circulating gas 20 through the center channel 13 and front channel 18. In this preferred embodiment, the subchannels 300 and 305 allow separate flow paths for closed loop circulating gas 20 within the center channel 13, without requiring additional fans. These separate flow paths which cross through the center and loop around the display in a single continuous flow, define the figure eight path for the closed loop circulating gas 20 (seen also in FIG. 1). Further, in this preferred embodiment, the flow direction of closed loop circulating gas 20 through the center channel 13 is opposite the flow direction of open loop air 15 and 10, creating a counter-flow heat exchanger between the center channel 13 and the front/rear open loop channels 11 and 16. However, this is not required, as a parallel flow or a cross flow design would work as well.

In an exemplary embodiment, the rear channel 30 would share a plate with the rear open loop channel 11, such that one side of the plate would be within the rear channel 30 while the opposing side of the plate would be within the rear open loop channel 11. This arrangement is illustrated in FIG. 3 with the rear plate 31. Similarly, it may be preferable for the center channel 13 and the rear open loop 11 to share a plate, such that one side of the plate is within the center channel 13 while the other side of the plate is within the rear open loop 11. Similarly, it may be preferable for the center channel 13 and the front open loop 16 to share a plate. Finally, it may also be preferable for the rear surface of the display 160 to form the front wall of the front open loop 16, such that open loop ambient air 15 can remove heat from the electronic display 160. In some embodiments the rear surface of the display 160 would be the rear surface of a metallic PCB holding a plurality of LEDs for the backlight.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A cooling assembly for an electronic display comprising:
   a front channel that passes in front of the viewable area of the electronic display;
   a center channel located behind the electronic display;
   a rear channel located behind the center channel;
   a first plurality of subchannels located within the center channel and connecting only to the front channel; and
   a second plurality of subchannels located within the center channel and connecting only to the rear channel;
   wherein the front channel, the center channel, and the rear channel form a continuous closed loop pathway for circulating gas.

2. The cooling assembly of claim 1 wherein:
   the first plurality of subchannels are connected to the front channel by way of a first plurality of pass through devices; and
   the second plurality of subchannels are connected to the rear channel by way of a second plurality of pass through devices.

3. The cooling assembly of claim 1 wherein:
   the first and second plurality of subchannels are configured to permit circulating gas to flow therethrough without substantially mixing.

4. The cooling assembly of claim 1 wherein:
   the front channel is further defined as extending between a front surface of the electronic display and a transparent plate.

5. The cooling assembly of claim 1 wherein:
   the rear channel comprises electronic components which are mounted to a plate.

6. The cooling assembly of claim 2 further comprising:
   an open loop pathway that passes between the front channel and the rear channel.

7. The cooling assembly of claim 6 further comprising:
   a second open loop pathway that passes between the front channel and the rear channel.

8. The cooling assembly of claim 6 wherein:
   the open loop pathway travels along a rear surface of the electronic display.

9. The cooling assembly of claim 6 wherein:
   each of the first and second plurality of pass through devices comprises an aperture, wherein the pass through devices are arranged such that circulating gas travels through the aperture while ambient air passes around the aperture.

10. A cooling assembly for an electronic display comprising:
    a first channel placed in front of the electronic display;
    a third channel placed behind the electronic display; and
    a second channel placed between the first channel and the third channel, wherein the second channel comprises a first plurality of subchannels and a second plurality of subchannels;
    wherein the first plurality of subchannels are connected only to the first channel;
    wherein the second plurality of subchannels are connected only to the third channel,
    wherein the second channel is configured to permit circulating gas to flow simultaneously through the first and second plurality of subchannels without substantially mixing;
    wherein said first, second, and third channels form a continuos closed loop pathway for circulating gas.

11. The cooling assembly of claim 10 further comprising:
    a first plurality of pass through devices connecting the first plurality of subchannels to the first channel; and
    a second plurality of pass through devices connecting the second plurality of subchannels to the third channel.

12. The cooling assembly of claim 10 wherein:
    the first, second, and third channels are interconnected in a way which forms a substantially figure eight shape.

13. The cooling assembly of claim 11 further comprising:
    a first open loop pathway for ambient air positioned between the electronic display and the second channel; and
    a second open loop pathway for ambient air positioned between the second channel and the third channel.

14. The cooling assembly of claim 13 further comprising:
    a closed loop fan positioned to force ambient air through at least one of the first, second, or third channels.

15. The cooling assembly of claim 14 further comprising:
    an open loop fan positioned to force ambient air though at least one of the first or second open loop pathways.

16. A cooling assembly for an electronic display comprising:
- a continuous closed loop pathway for circulating gas comprising:
  - a front channel defined by the space between a front surface of the electronic display and a transparent plate;
  - a plate positioned behind the electronic display;
  - a rear channel defined by the space between the plate and the rear surface of the cooling assembly; and
  - a center channel located between the plate and the rear surface of the electronic display and comprising a first number of independent subchannels and a second number of independent subchannels;
  - wherein the first number of independent subchannels connect only to the front channel;
  - wherein the second number of independent subchannels connect only to the rear channel.

17. The cooling assembly of claim 16 wherein:
the center channel is configured to allow the circulating gas to travel through any of said independent subchannels without substantially mixing with circulating gas traveling through any of the other independent subchannels.

18. The cooling assembly of claim 17 further comprising:
- a first plurality of pass through devices connecting the first number of independent subchannels to the front channel; and
- a second plurality of pass through devices connecting the second number of independent subchannels to the rear channel.

19. The cooling assembly of claim 18 further comprising:
an open loop for ambient air configured to pass between the front and the rear channels without mixing the ambient air and the circulating gas.

20. The cooling assembly of claim 19 further comprising:
- at least one closed loop fan positioned to force the flow of the circulating gas through the closed loop; and
- at least one open loop fan positioned to force the flow of the ambient air through the open loop.

* * * * *

UNITED STATES PATENT AND TRADEMARK OFFICE
CERTIFICATE OF CORRECTION

PATENT NO. : 10,359,659 B2
APPLICATION NO. : 16/114049
DATED : July 23, 2019
INVENTOR(S) : William Dunn et al.

Page 1 of 1

It is certified that error appears in the above-identified patent and that said Letters Patent is hereby corrected as shown below:

Page 4, Column 1, Line 21, References Cited, U.S. Patent Documents, please delete "2011/0141724 A1 65/2011 Edon" and insert -- 2011/0141724 A1 6/2011 Erion --.

Signed and Sealed this
Fifth Day of November, 2019

Andrei Iancu
*Director of the United States Patent and Trademark Office*